(12) United States Patent
Gouin et al.

(10) Patent No.: US 7,486,540 B2
(45) Date of Patent: Feb. 3, 2009

(54) MEMORY DEVICE WITH IMPROVED WRITING CAPABILITIES

(75) Inventors: Vincent Gouin, Mandelieu (FR);
Christophe Chanussot, Antibes (FR)

(73) Assignee: Infineon Technologies AG, Munich (DE)

(*) Notice: Subject to any disclaimer, the term of this patent is extended or adjusted under 35 U.S.C. 154(b) by 22 days.

(21) Appl. No.: 11/553,094

(22) Filed: Oct. 26, 2006

(65) Prior Publication Data
US 2007/0109878 A1 May 17, 2007

(30) Foreign Application Priority Data
Oct. 26, 2005 (EP) ................................. 05023410

(51) Int. Cl.
*G11C 11/00* (2006.01)
(52) U.S. Cl. .................. 365/154; 365/198.16
(58) Field of Classification Search ................. 365/154, 365/189.16
See application file for complete search history.

(56) References Cited

U.S. PATENT DOCUMENTS

| 4,404,661 | A | 9/1983 | Nagayama et al. |
| 4,493,056 | A | 1/1985 | Mao |
| 6,671,201 | B2 * | 12/2003 | Masuda ...................... 365/154 |
| 2004/0057277 | A1 | 3/2004 | Fujita et al. |

FOREIGN PATENT DOCUMENTS

EP 0 632 462 1/1995

* cited by examiner

*Primary Examiner*—Hoai V Ho
(74) *Attorney, Agent, or Firm*—Patterson & Sheridan, L.L.P.

(57) ABSTRACT

Method and memory device for reliably writing an information value to a memory element of the memory device. A first information value is represented by a first potential and a second information value is represented by a second potential. A bit line is provided for writing either the first information value or the second information value to the memory element. A potential controller is coupled to the bit line, where the potential controller is configured to apply a third potential to the bit line, which is less than the first potential when writing the first information value to the memory element.

17 Claims, 5 Drawing Sheets

MEMORY DEVICE WITH IMPROVED WRITING CAPABILITIES

CROSS-REFERENCE TO RELATED APPLICATIONS

This application claims foreign priority benefits under 35 U.S.C. §119 to co-pending European patent application number EP 05 023 410.3, filed 26 Oct. 2005. This related patent application is herein incorporated by reference in its entirety.

BACKGROUND OF THE INVENTION

1. Field of the Invention

The invention relates to memory devices.

2. Description of the Related Art

When manufacturing SRAM cells in deep sub-micron technologies characteristics, errors like instability, write fail and read fail are expected due to large statistical deviations of the SRAM cells. Since a recovery of the manufacturing errors is costly, designing memory peripheries only addressing the bit cells is not efficient. The memory periphery has to take the statistical deviations into account.

For example, due to a high sensitivity of memory cells with respect to statistical fluctuations of parameters of elements forming the memory cells, e.g. transistors, the write operation of e.g. SRAM cells limits the possibility of employing a low voltage technology (using e.g. VDD=0.75 V) for memory cells.

In order to access a memory cell, usually an access transistor coupling a bitline to the memory element is activated for e.g. transferring a certain potential representing an information value (e.g. a "0") to the memory cell. However, e.g. a positive voltage variation across the access transistor may superimpose the certain potential. If the resulting potential at the memory cell exceeds a certain threshold determined by the low voltage technology (e.g. 0.35 V), then a write error occurs. For example, if the threshold voltage of the access transistor is sufficiently high, this can lead to the impossibility of writing the "0" into the cell.

SUMMARY OF THE INVENTION

One aspect of the invention is to reliably write to the memory cell.

According to an aspect of the invention, either a first information value (e.g. a "0") or a second information value (e.g. a "1") are written to a memory cell via a bit line coupled to the memory cell via e.g. an access transistor. The first information value may be represented by a first potential (e.g. VSS or ground) and the second information value may be represented by a second potential (e.g. VDD). Thus, one unique information unit that can have two values either a low value "0" or an high value "1", corresponding to the first potential (e.g. VSS or ground) or the second potential (e.g. VDD), respectively, can be stored in the inventive memory cell.

Embodiments of the invention are based on the finding that the reliability of a write operation can be increased when reducing the potential of the bit line below the first potential, e.g. below VSS, when writing the first information value represented by the first potential to the memory element. According to the invention, the bit line is boosted under the first potential during the write operation for at least a time interval so that statistical positive voltage variations increasing the potential to be transferred are at least partly compensated so that the cell has time to flip completely. Therefore, even low voltage technologies may be employed for operating the memory cells.

The invention provides a memory device comprising a memory element (e.g. an SRAM) for storing either the first information value which is represented by the first potential (e.g. VSS) and for storing a second information value which is represented by a second potential (e.g. VDD), with the second potential being greater than the first potential. The memory device further comprises a bit line for writing either the first or the second information value to the memory element.

The bit line may be coupled to the memory element via an activable switch (e.g. a transistor). In order to write information to the memory element, the switch is activated to connect the bit line to an access node of the memory element. If the switch is deactivated, then the bit line is de-coupled from the access node.

According to the invention, a potential controller is provided which is coupled (e.g. electrically connected) to the bit line. The potential controller is configured to apply a third potential to the bit line, the third potential being less then the first potential when writing the information value to the memory element. In other words, the potential controller is configured to reduce the potential of the bit line below the first potential (e.g. below VSS) in order to write the first information value representing (e.g. a "0") to the memory element. The third potential may be e.g. ⅕ to ¹⁄₁₀ of the first potential in reference to a reference potential. The reference potential may by formed by VSS or by the ground.

For example, the first potential may be equal to VSS. If VDD and VSS are applied to the memory element for storing information, then the first potential represents the lowest potential applied to the memory element. Thus, the first potential may represent the reference potential.

According to an aspect of the invention, the memory element is a volatile memory element which is configured to store either the first or the second information value when e.g. the first potential is applied to a first power supply terminal and the second potential is applied to a second power supply terminal of the memory element. According to the invention, the potential controller is configured to undershoot the lowest potential applied to a power terminal of the memory element when writing an information value which is represented by the lowest potential applied to the memory element.

Preferably, the potential reduction is performed without employing an additional power source. According to one embodiment of the invention, the potential controller comprises a potential circuit coupled to the bit line, the potential circuit generating the third potential which is to be applied to the bit line. According to an aspect of the invention, the potential circuit may be configured to generate the third potential in response to a control signal provided by the potential controller. For example, the control signal comprises a pulse or represents a pulse. In this case, the potential circuit may be configured to generate the third potential in response to a rising or to a falling edge of the pulse.

According to an aspect of the invention, the potential circuit may be configured to gradually reduce the potential of the bit line. For example, the potential circuit may be configured to reduce the potential of the bit line from e.g. VDD to VSS during a first time interval. Subsequently, the potential circuit may apply the third potential to the bit line (i.e. to reduce the potential of the bitline from VSS to the third potential) during a subsequent second time interval in response to a falling edge of the pulse. Thus, the length of the time interval during which the potential of the bit line is reduced to the first potential (e.g.

VSS) is determined by the length of the pulse. The length of the subsequent second interval during which the third potential is applied to the bit line may further be determined by the potential controller. For example, the potential controller is configured to apply another pulse to the potential circuit, the rising edge of the other pulse determining the beginning of the first interval, the falling edge of the other pulse determining the beginning of the second interval during which the third potential is applied to the bit line. After the second interval, the potential applied to the bit line may return to the initial potential, e.g. to VDD.

In order to generate the third potential, the potential circuit may comprise a charge injection capacitor, which introduces the desired effect of undershooting the first potential.

According to an aspect, the memory element may be accessed differentially for writing either the first or the second information value to the memory element (e.g. SRAM or DSRAM). In order to provide for differentially accessing to the memory element, the memory device may comprise a further bit line (e.g. a complementary bit line or bit line bar) for accessing to the memory element. The bit line may be coupled to a further access node of the memory element via e.g. a further activable switch.

According to the invention, the potential controller is also coupled to the further bit line so that either the first or the second information value may differentially be transferred to the memory element during a writing operation. More specifically, the potential controller may be configured to apply the second potential to the bit line (e.g. VDD) and to apply the third potential to the further bit line when writing the second information value to the memory element. Thus, the difference between the potential of the bit line and the potential of the further bit line is increased when compared to the conventional accessing methods by the amount of the third potential undershooting the first potential. Alternatively, the potential controller may apply the third potential to the bit line and the second potential to the further bit line in order to store the first information value in the memory element.

According one embodiment of the invention, the controller may comprise a further potential circuit coupled to the further bit line for generating the third potential to be applied to the further bit line. For example, the controller may be configured to activate only the potential circuit coupled to the bit line or to activate only the further potential circuit coupled to the further bit line during the same write operation. Thus, the potential circuit and the further potential circuit may simultaneously receive complementary control signals from the potential controller. If the potential circuit is deactivated, then e.g. the second potential (for example VDD) is continuously applied to the bit line.

The inventive concept may also be applied when writing the second information value to the memory element. More specifically, one embodiment of the invention provides a memory device comprising a memory element for storing the first or the second information value, a bit line coupled to the memory element and a potential controller coupled to the bit line, the potential controller being configured to apply a third potential to the bit line when writing the second information value represented by the second potential to the memory element, the third potential exceeding the second potential. In other words, the potential controller may be configured to increase the potential of the bit line above the second potential in order to mitigate the influence of e.g. negative voltage variations across e.g. an access transistor to increase the potential transmitted through the access transistor.

In order to generate the third potential above the second potential or in order to increase the second potential, the potential controller may comprise a potential circuit with a capacitor for injecting a positive charge when writing the second information value to the memory element. However, the second potential may also be generated from the (positive) third potential using e.g. a voltage divider. The potential circuit may have exactly the same structure as one of the potential circuits described below. Generally, the descriptions relating the reducing the potential of the bitline also apply to the aspect related to increasing the potential of the bitline.

In either case, the direct (e.g. capacitive) boosting of the bit line has the advantage that an additional voltage generator or regulator is not necessary. Thus, the inventive approach is efficient with respect to area occupation and to static and dynamic power consumption. Moreover, the inventive approach does not impact the timing of the writing operation since the inventive boost of the bit line (i.e. overshot or undershot) is performed during the write operation.

In order to improve the write operation, e.g. a wordline boosting can be used which, however, may degrade the stability of the selected cells. The inventive bit line boosting does not negatively affect the stability of the memory cell.

Moreover, the inventive concept may be applied for low voltage applications since a boost of e.g. 100 mV recovers 200 mV in low voltage functionality limit.

Another solution is to decrease the VDD supply of the column to which the cell to be written pertains. The cells which are not accessed to are not influenced by this change. The benefit is that the drive of the PMOS pull-up of the memory cell is decreased and therefore the access transistor can more easily force a "0". However, the drive of e.g. a PMOS driving the complementary node of the bit cell is also decreased and consequently establishing VDD on this node is made more difficult. Moreover, one VDD vertical track per memory cell column has to be built in the layout which increases an area demand which e.g. make more difficult a robust VDD power net.

An aspect of the present invention is to boost a write potential below VSS on the bit line that forces the "0" into the bitcell. Since the bit line is the source of the access transistor, this increases significantly the drive current of that transistor so that the pull-up can efficiently be mitigated. This is an effective approach since the access transistor is by far (3 times) the most sensitive transistor of the bitcell with respect to the write operation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
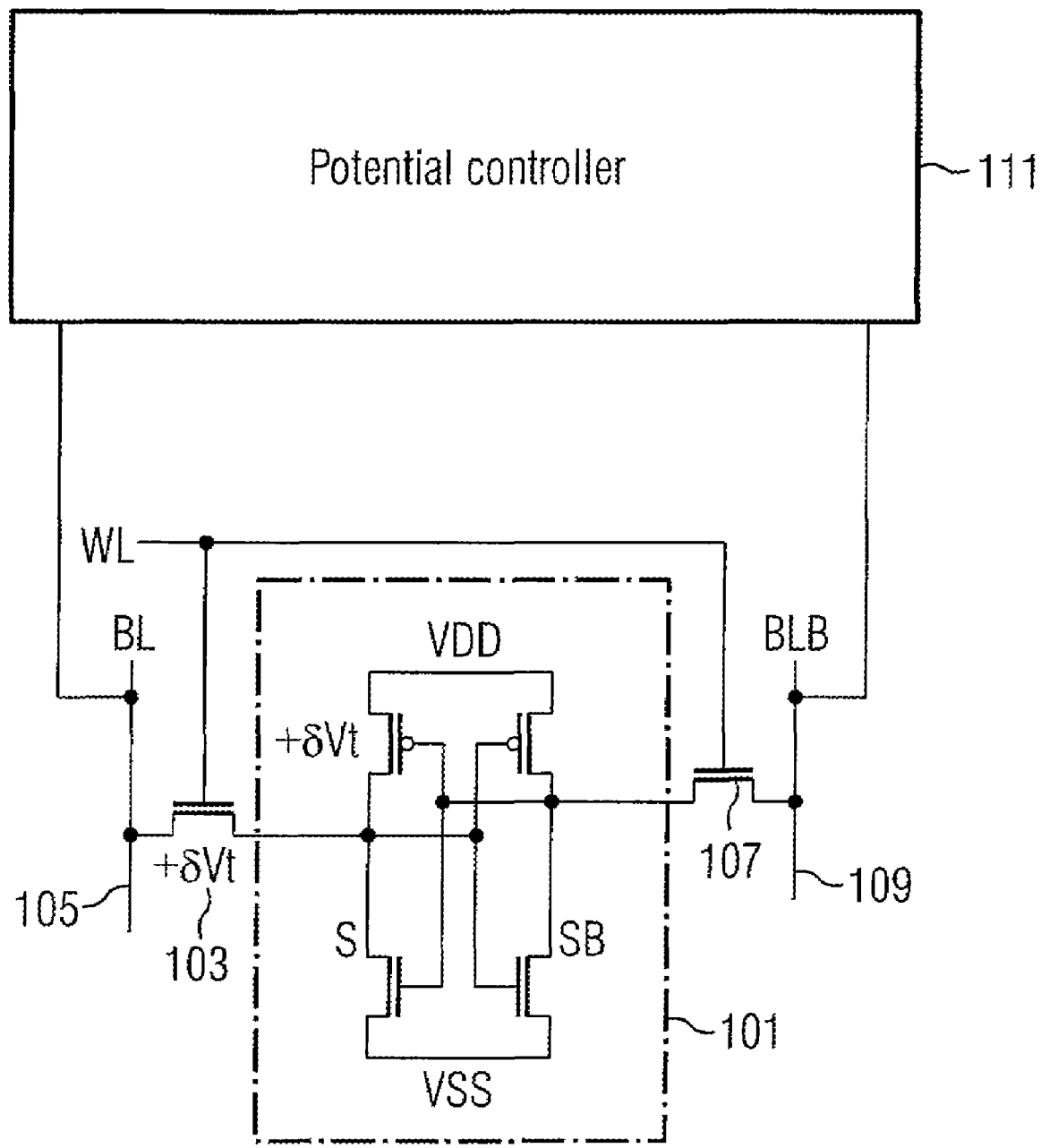
FIG. 1 shows a memory device according to an embodiment of the invention.

The memory device shown in FIG. 1 comprises a memory element 101 coupled via a transistor 103 to a bit line 105. The memory element 101 is further coupled by a further switch 107 to a further bit line 109.

The switches 103 and 107 are formed by transistors having control gates coupled to a wordline WL. The memory device further comprises a potential controller 111 having a first terminal coupled to the bit line 105 (BL) and a second terminal coupled to the further bit line 109 (BLB).

As depicted in FIG. 1, across the transistor 103 a threshold voltage variation +δVt may be present, which may increase the absolute threshold voltage Vt when writing a "0" from the bit line 105 to the memory cell by e.g. a weak N access device. Correspondingly, the varying voltage across the transistor 103 may contribute to a reduction of the absolute voltage Vt when e.g. writing a "0" via the bit line 105 for the case of a strong P load.

The memory element 101 is accessed to via the bit lines 105 and 109 and the transistors 103 and 107. As depicted in FIG. 1, the memory element 101 is coupled between VSS (e.g. first potential) and VDD (e.g. second potential). Thus, when writing VSS to the memory element for e.g. storing a logical zero ("0"), the potential of the bit line 105 is usually reduced to VSS. However, the positive threshold voltage variation of transistor 103 increases the potential arriving at the memory element 101. Depending on the variation of the threshold voltage of transistor 103, the potential arriving at the memory element 101 may exceed a threshold (e.g. half the difference between VDD and VSS) and may hence introduce an impossibility of writing VSS to the memory element 101.

According to the invention, the potential controller 111 is configured to reduce the potential at the bit line 105 below VSS and to maintain the potential at the further bit line 109 at e.g. VDD in order to store a "0" in the memory element 101. Correspondingly, the potential controller 111 may be configured to reduce the potential at the further bit line 109 below VSS (e.g. to apply a third potential which is less than VSS) and to maintain the potential at the bit line 105 at its initial state (e.g. the second potential, VDD) in order to store a "1" in the memory element 101.

The memory element 101 may comprise four transistors forming a latch wherein the transistor 103 couples the bit line 105 to the memory element 101 via the access node S and wherein the transistor 107 couples the further bit line 109 to a further access node SB.

The transistors 103 and 107 are activated upon receiving an activation signal via the wordline WL. The activation signal may be applied to the wordline WL by the potential controller 111.

According to another aspect, a second potential is applied to the bit line 105 (e.g. VDD) and is reduced by the amount of a negative voltage variation through transistor 103 so that the potential arriving at the memory element 101 via the access node S is less than VDD which may introduce an impossibility of writing the memory element 101. In this case, the potential controller 111 may be configured to increase the potential of the bit line 105 in order to compensate the negative voltage variation. In this case, the potential controller 111 applies a third potential to the bit line 105 which is greater than e.g. VDD for writing to the memory element 101. Simultaneously, the potential controller 111 may reduce the potential of the bit line 109 to VSS or may even reduce the potential of the bit line 109 below VSS in order to increase the effective potential difference between the bit lines 105 and 109 for reliably writing e.g. a "1" to the memory element 101.

For the sake of brevity, the following embodiments will be described with respect to the negative bit line boost. It shall, however, be noted that the inventive concept also applies to the case of the positive bit line boost.

According to an aspect of the invention, the bit line is boosted below VSS during the write operation. This recovers the voltage Vgs of an access transistor (e.g. transistor 103 or 107) suffering from large Vt fluctuations. The access transistor is the most sensitive element with respect to voltage variation during a write operation.

Figure 2:
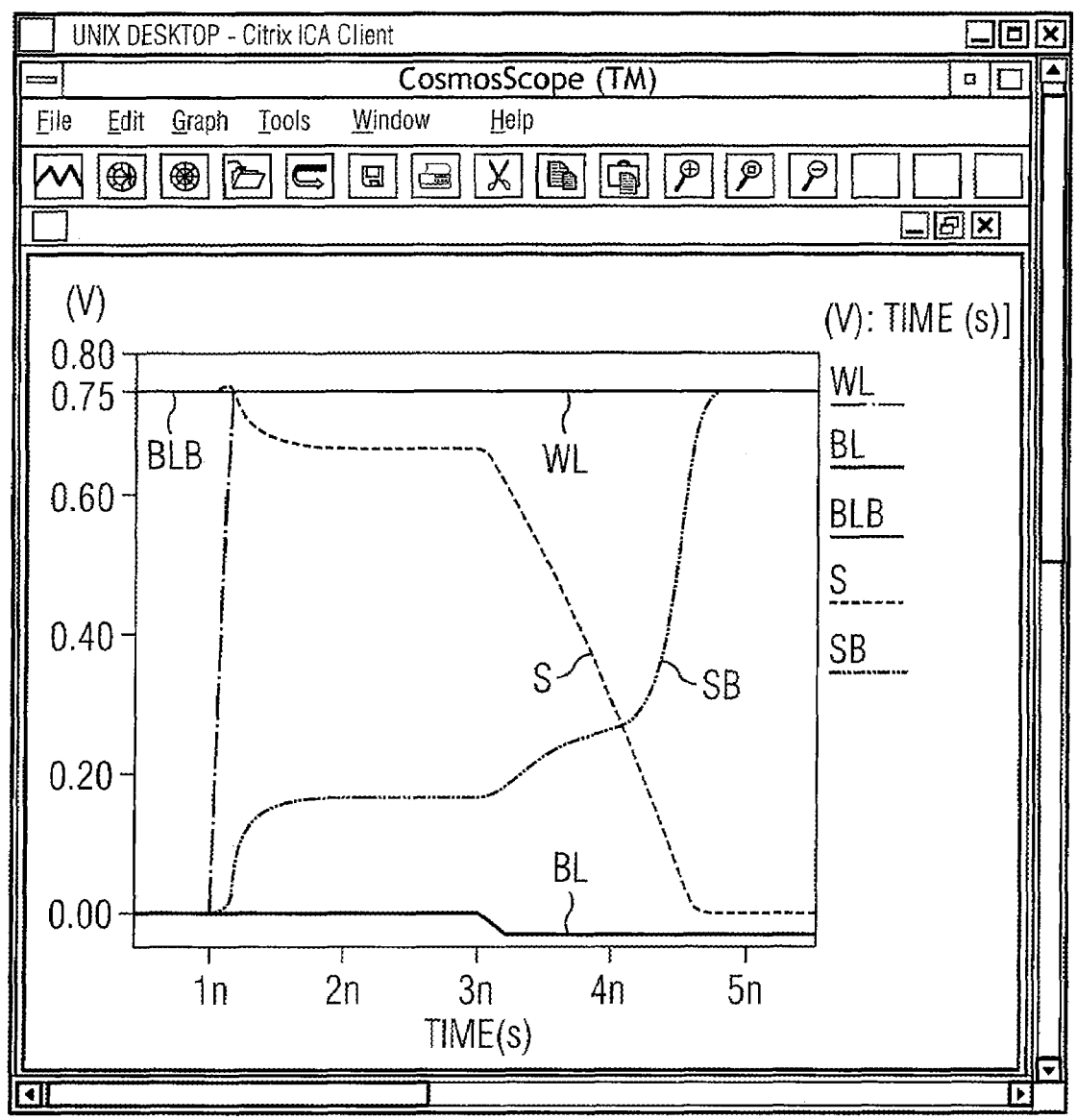
FIG. 2 demonstrates the inventive bit line boosting.

FIG. 2 demonstrates the effect of the negative bit line boost on the potentials at the nodes S and SB.

Upon activating the wordline WL, the potential at the access node S decreases and the potential at the access node SB increases. The potential at the bit line 109 (BLB) remains at the level 0.75 V (VDD). Simultaneously, the potential at the bit line 105 (BL) is reduced from 0 V (VSS) to a third potential which is approximately −0.1 V. For example, while the bitline is not below VSS, the cell is not written because node S doesn't decrease enough toward VSS. Then, the bitline reduction below VSS enables the writing of the cell.

Figure 3:
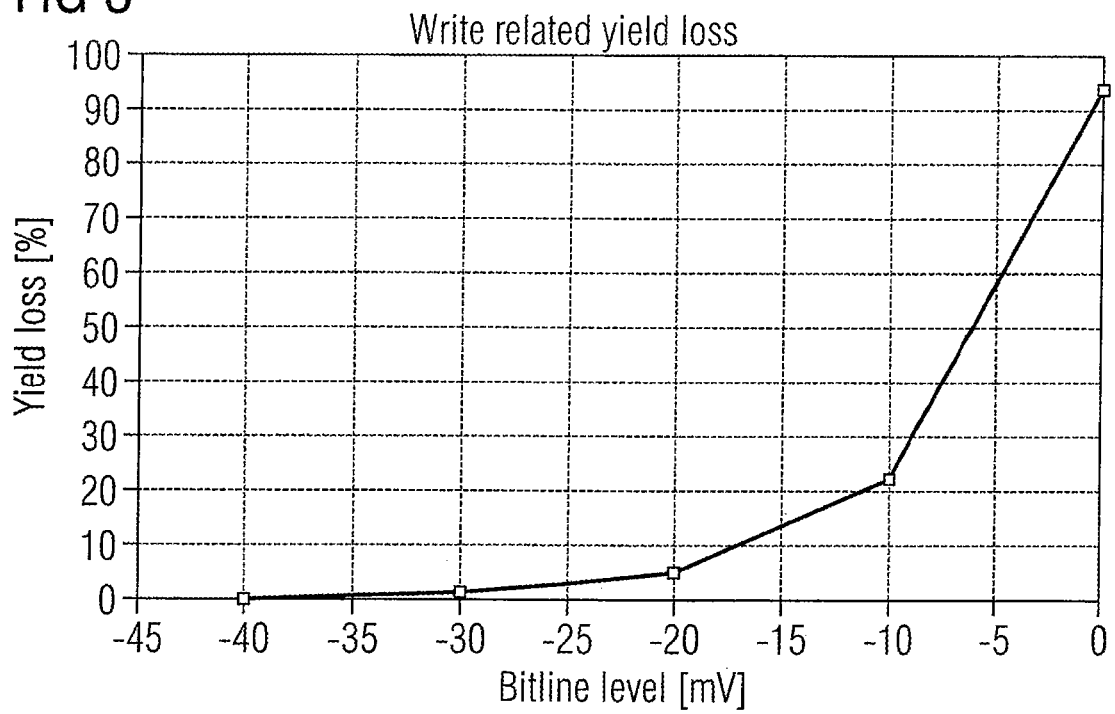
FIG. 3 demonstrates the influence of the negative bit line level onto the yield gain.

FIG. 3 demonstrates the translation of the benefits of the negative bit line boost into yield gain. The negative boost, which is to be performed, is in the order of e.g. 10 to 200 mV. Consequently, the potential controller providing the negative boost may be embedded inside the memory device without any additional voltage generator since a capacitive boosting of the bit line may be employed.

Figure 4A:
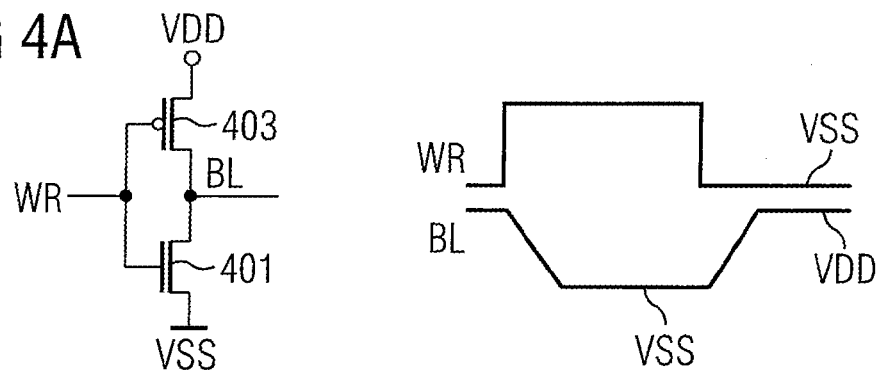
FIG. 4a shows a potential circuit.

According to an embodiment, the inventive controller may comprise a potential circuit (a buffer) for applying the third potential to the bit line (i.e. for reducing the potential of the bit line from e.g. VDD to e.g. −10 mV). The inventive potential circuit may be formed upon a basis of a conventional write potential circuit shown in FIG. 4a with a transistor 401 and a transistor 403 arranged in series. In particular, a first terminal of the first transistor 401 is coupled to a second terminal of the transistor 403. The bit line BL is coupled to an intermediate point between the transistors 401 and 403. Moreover, the control terminals of the transistors 401 and 403 (e.g. gates) are connected. When applying an activation signal WR to the gate terminals of the transistors 401 and 403, the potential of the bit line BL falls from VDD to VSS representing ground.

Figure 4B:
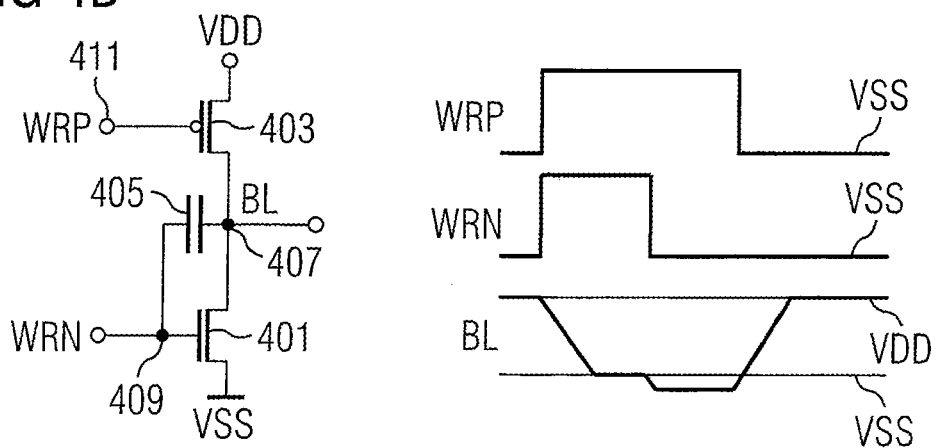
FIG. 4b shows a potential circuit with bit line boosting according to the invention.

FIG. 4b shows a write potential circuit with negative bit line boosting according to an embodiment of the invention. The potential circuit comprises a capacitor 405 coupled between a node 407 and a control terminal 409 of the transistor 401, the node 407 connecting the first terminal of the transistor 401 and the second terminal of the transistor 403. The control terminal 409 (e.g. a gate) of the transistor 401 and a control terminal 411 of the transistor 403 are disconnected. The transistors 401 and 403 may be e.g. MOSFET transistors.

In order to achieve the negative bit line boost, a pulse WRP is applied to the control terminal 411 of the transistor 413 and a pulse WRN is applied to the control terminal 409 of the transistor 401. The rising edge of the pulse WRN activates the transistor 401 while the rising edge of the pulse WRP deactivates the transistor 401. Thus, the bit line BL coupled to the node 407 discharges via the transistor 401 to Vss. The falling edge of the pulse WRN has the effect of a negative charge transfer causing the potential of the bit line BL to fall below VSS during a subsequent time interval. The transistor 403 is then activated again upon receiving a falling edge of the pulse WRP, which causes the potential of the bit line BL to rise to the initial potential VDD. In this respect, VSS represents the first potential, VDD represents the second potential and the potential below VSS represents the third potential.

FIGS. 5a to 5f show several potential circuits for applying the third potential to a bitline according to the invention.

Figure 5A:
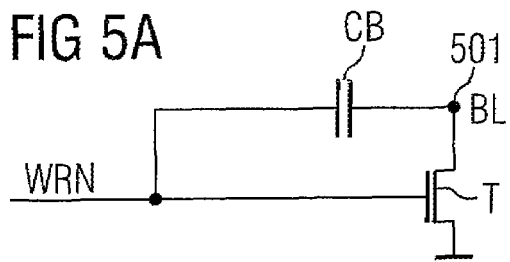
FIGS. 5a to 5f show potential circuits according to the invention.

FIG. 5a shows a potential circuit comprising a transistor T having a first terminal 501 and a second terminal coupled to VSS or to ground. The first terminal 501 is connected via a capacitor CB to a control terminal (e.g. to a gate) of the transistor T. The first terminal 501 is connected to the bit line BL.

The transistor T as shown in FIG. 5a may be an NMOS transistor of a write potential circuit with the boosting capacitor CB. The transistor T and the capacitor CB have a common control net WRN.

The potential controller is configured to apply the pulse WRN shown in FIG. 4b to the control terminal of the transistor T in order to apply the third potential to the bit line BL, i.e. in order to reduce the potential of the bit line BL below VSS. The capacitor CB introduces a charge injection in response to the falling edge of the pulse WRN, which generates a potential below VSS.

Figure 5B:
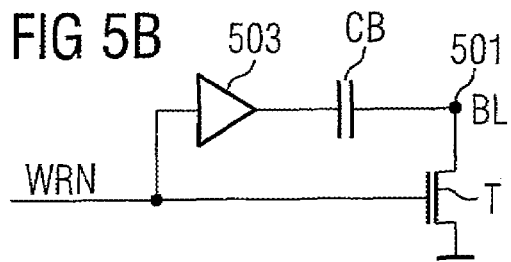

The potential circuit shown in FIG. 5b additionally comprises a delay element 503 (e.g. a buffer) coupled between the control terminal of the transistor T and the capacitor CB. The delay element 503 delays the boosting capacitor control signal WRN with respect to the transistor control signal. Therefore, the transistor T is off during the whole boosting phase which increases the efficiency of the boost.

Figure 5C:
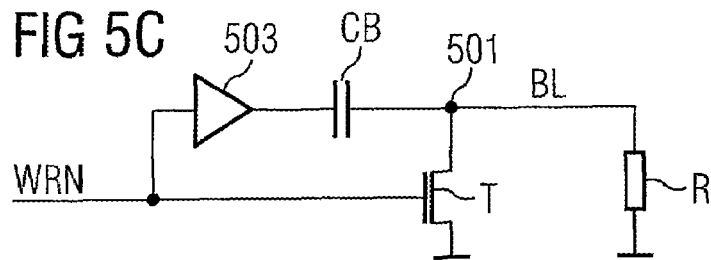

FIG. 5c shows a potential circuit additionally having a resistor R coupled in parallel to the transistor T. The resistor R controls the amplitude of the boost. Another advantage is that the output impedance can be tuned independently on the boost amplitude.

Figure 5D:
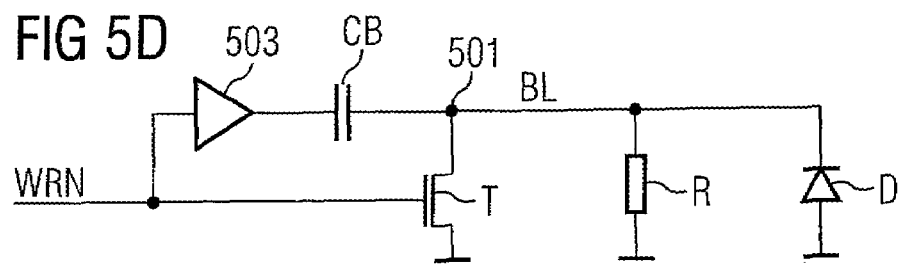

FIG. 5d shows a potential circuit comprising a diode D coupled in parallel to the resistor R. The cathode of the diode D is coupled to the capacitor CB and to the first terminal 501 of the transistor T. The diode D shown in FIG. 5d limits the boost amplitude to a predetermined threshold.

Figure 5E:
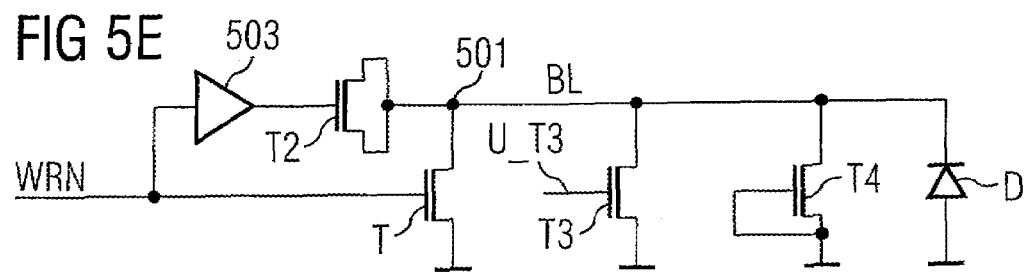

FIG. 5e shows a potential circuit comprising a transistor T2 being arranged to form a capacitor. The potential circuit further comprises a transistor T3 coupled in parallel to the transistor T. The transistor T3 is arranged to form a resistor in response to a control voltage U_T3 applied to a control terminal of the transistor T3. Thus, the value of the resistance is variable depending on the voltage U_T3 so that a different attenuation of the negative potential may be adjusted. The potential circuit further comprises a resistor T4 coupled in parallel to the transistor T3. The transistor T4 is arranged to form a diode and limits the amplitude of a negative potential peak at the bitline BL. The transistor T and the transistor T4 forming a diode shown in FIG. 5e may be MOS transistors, wherein the diode D may be a N-P diode. The transistor T3 that is used as a resistor has its gate dynamically controlled to activate it only during the write operation.

Figure 5F:
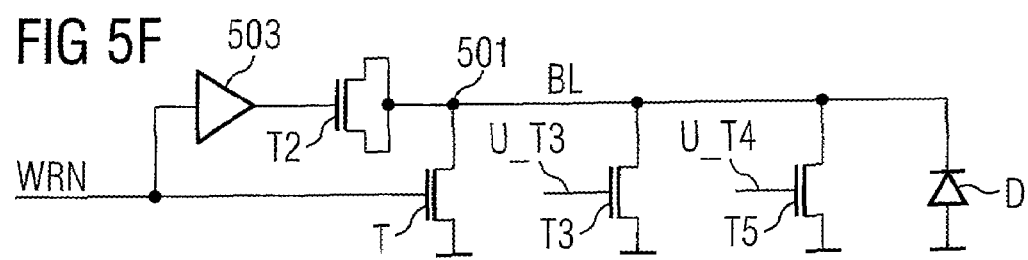

FIG. 5f shows a potential circuit comprising a transistor T5 coupled in parallel to the transistor T3. The transistor T5 is arranged to form a resistor with variable resistance depending on a control voltage U_T4 applied to a control terminal of the transistor T5 (e.g. to the gate). The transistor T5 limits the amplitude of a negative potential peak applied to the bit line 501. In FIG. 5f, the MOS diode is replaced by a MOS transistor T5 a gate of which is controlled by signal U_T4 with a voltage dV4. The advantage is that the diode starts to pass when the bit line goes below (−Vt4+dV4), as compared to the MOS diode with VSS on its gate where the activation level was fixed to −Vt4.

In the embodiments shown in FIGS. 5a to 5f, the second terminals of the transistors T, T2, T3, T4 or T5 are connected to the first potential (e.g. ground or VSS). Furthermore, all control signals may be generated by the potential controller 111.

Figure 6:
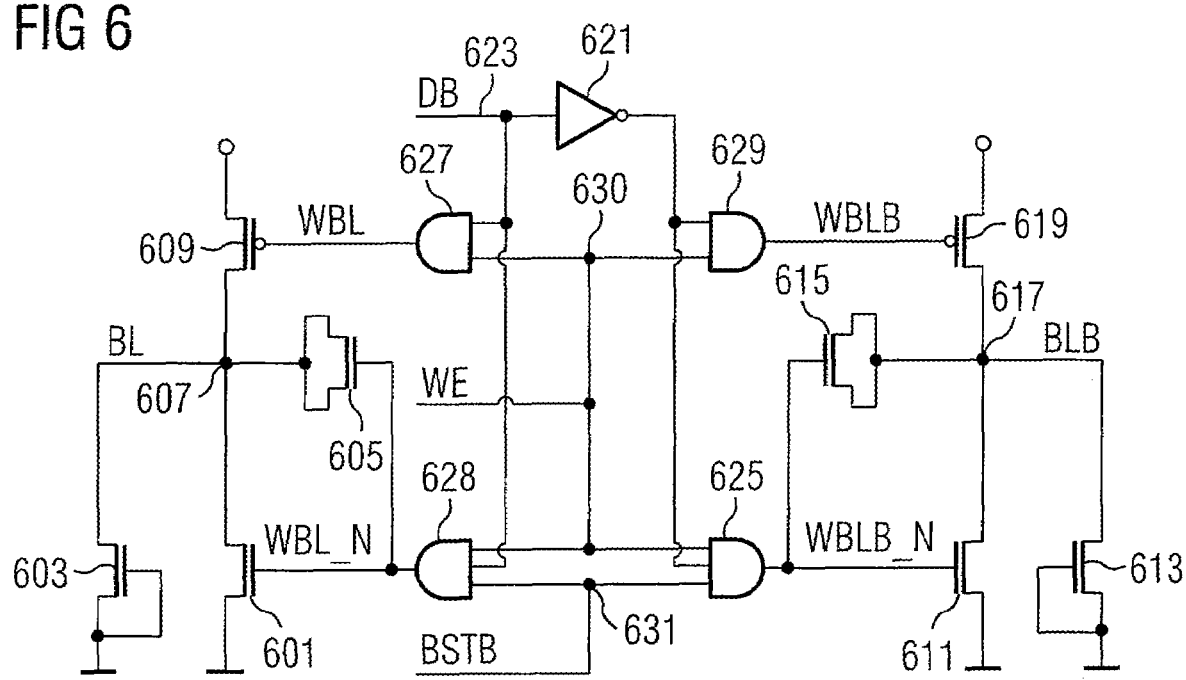
FIG. 6 shows a memory device for a differential write operation.

FIG. 6 shows an embodiment of the potential controller arranged to differentially control the potentials of the bit lines BL and BLB during a write operation.

The potential controller comprises a first potential circuit with a transistor 601 and a transistor 603 coupled in parallel to the transistor 601. The transistor 603 is arranged to form a diode. The first potential circuit further comprises a transistor 605 forming a capacitor, the transistor 605 being coupled between a first node 607 and a control terminal of the transistor 601. The first potential circuit further comprises a transistor 609 having a first terminal for receiving e.g. VDD and a second terminal coupled to the first node 607. The potential controller further comprises a second potential circuit comprising the transistors 611, 613, 615, a second node 617 and a transistor 619. The first potential circuit and the second potential circuit are arranged in the same way.

The potential controller further comprises an inverter 621 having an input 623 and an output coupled to a gate 625. An output of the gate 625 is coupled to a control terminal of the transistor 611 of the second potential circuit. The input 623 of the inverter 621 is coupled to an input of a gate 627 and to an input of a gate 628. The output of the inverter 621 is coupled to an input of the gate 629.

An output of the gate 629 is coupled to a control input of the transistor 619, an output of the gate 627 is coupled to a control input of the transistor 609, an output of the gate 628 is coupled to a control input of the transistor 601. An input of the gate 627 and an input of the gate 629 are connected via a node 630. An input of the gate 628 and an input of the gate 625 are connected to the node 630. Other inputs of the gates 628 and 625 are connected to a node 631.

In operation, the potential controller is coupled to the bit line BL via the node 607 and to the further bit line BLB via the node 617. The gates 628 and 625 generate the signals WBL_N and WBLB_N, respectively. The signal WBL_N activates the transistor 601 and the signal WBLB_N activates the transistor 611. Correspondingly, the gates 627 and 629 output control signals WBL and WBLB activating the transistors 609 and 619, respectively.

The signals WBL, WBLB, WBL_N, WBLB_N are generated in response to a data signal DB applied to the input 623 of the inverter 621 in dependence on a control signal WE applied to the node 630 and a control signal BSTB applied to the node 631. It shall be noted that the first potential circuit and the second potential circuit are based on the potential circuit shown in FIG. 4b with the transistors 603 and 613 being arranged to form diodes. The capacitor is directly connected to the net driving the gate of the NMOS pull-down. No resistor is used on the bit lines. The diode is a MOS diode built with an NMOS.

Although there is no resistor for regulation and no delay to control the capacitor (intended to improve the efficiency of the boost), the structure performs a regulation of the boost amplitude. Indeed, while the capacitor is injecting charges on the bit line, the NMOS pull-down is being switched off at the same time. Consequently, during the charge injection, the NMOS pull-down is partially on, thus performing a regulation.

The write operation within an SRAM memory is improved by the inventive circuit which is pulling down at a negative voltage all the selected bit lines. This negative boost of the bit line increases significantly the drive current of the access transistors of the core cell and therefore eases the write of the zero into the cell, especially at low voltage. The boosting circuit is added to the write potential circuit and comprises a capacitive element having its first node coupled to the bit line and its second node coupled to a dynamic signal of the memory. The bit line boost has the maximum amplitude when the boost signal has the negative transition after the complete discharge to VSS of the bit line.

One of the most efficient ways to make the capacitive element is a MOS transistor with the gate being connected to the boost signal and the drain-source to the bit line. Some other devices like a resistor or a diode arranged in parallel to the pull-down device of the write potential circuit allow to control the amplitude of the bit line boost more efficiently.

Figure 7:
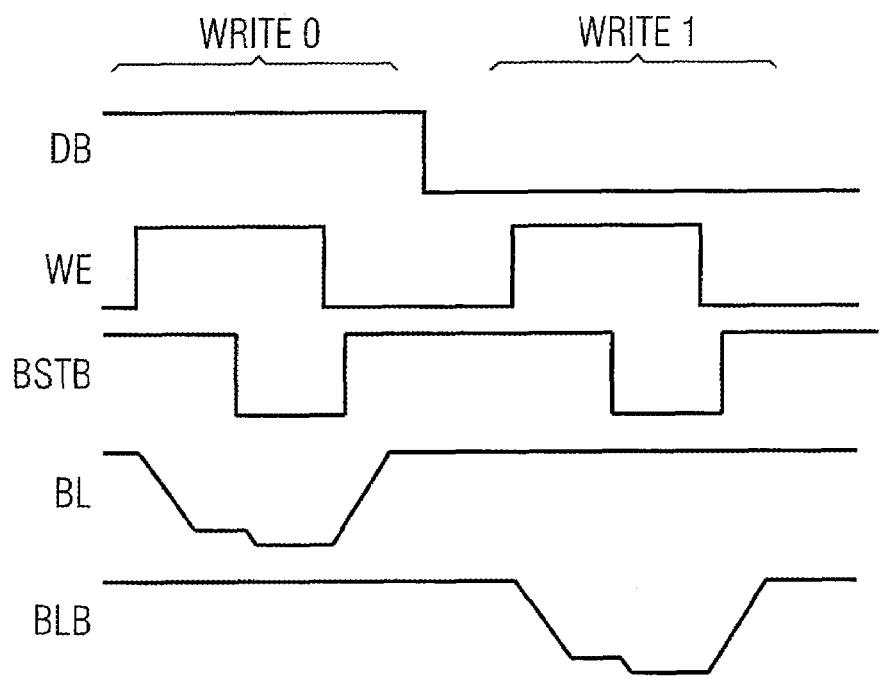
FIG. 7 shows signal diagrams associated with the embodiment of FIG. 6.

FIG. 7 shows signal diagrams associated with operating the write stage shown in FIG. 6. Due to the differential operation, the potential at the bit line BLB remains unchanged when the potential at the bit line BL is reduced and vice versa. Bit lines are initially charged to e.g. VDD.

One possible advantage of an embodiment of the inventive negative bit line boosting is that the write operation is strongly improved without any counter effect. The access transistor, which is the most sensitive one, is strengthened. Furthermore, degradation of the drive of the pull-up transistors is mitigated or avoided. Consequently, establishing the complementary value VDD is facilitated. Simultaneously, the stability of the cells selected by the wordline is not affected. One embodiment of the invention operates with the dedicated management of the bitline. Consequently, a further advantage over solutions acting on the memory cell supply is that no additional net, like a local VDD dedicated to the column, has to be built in the memory cell array.

While the foregoing is directed to embodiments of the present invention, other and further embodiments of the invention may be devised without departing from the basic scope thereof, and the scope thereof is determined by the claims that follow.

What is claimed is:

1. A memory device, comprising:
 a memory element for storing an information value selected from a first information value being represented by a first potential and a second information value being represented by a second potential, the first potential being less than the second potential;
 a bit line for selectively writing the first information value or the second information value to the memory element; and
 a potential controller coupled to the bit line, the potential controller being configured to apply a third potential to the bit line, which is less than the first potential when writing the first information value to the memory element, wherein the potential controller comprises a potential circuit coupled to the bit line, wherein the potential circuit is configured to reduce the potential of the bit line to the first potential in response to a rising edge of a pulse during a first time interval and to apply the third potential to the bit line during a subsequent second time interval in response to a falling edge of the pulse.

2. The memory device according to claim 1, wherein the memory element is a volatile memory element storing either the first or the second information value when the first potential is applied to a first power supply terminal of the memory element and the second potential is applied to a second power supply terminal of the memory element.

3. A memory element for storing an information value selected from a first information value being represented by a first potential and a second information value being represented by a second potential the first potential being less than the second potential;
 a bit line for selectively writing the first information value or the second information value to the memory element; and
 a potential controller coupled to the bit line, the potential controller being configured to apply a third potential to the bit line, which is less than the first potential when writing the first information value to the memory element, wherein the potential controller comprises a potential circuit coupled to the bit line for generating the third potential, the potential circuit comprising a transistor and a capacitor, the capacitor being coupled between a first terminal of the transistor and a control terminal of the transistor, the first terminal being coupled to the bit line.

4. The memory device according to claim 3, wherein the potential circuit comprises a delay element coupled between the control terminal of the transistor and the capacitor.

5. The memory device according to claim 3, wherein the potential circuit comprises a resistive element coupled in parallel to the transistor.

6. The memory device according to claim 5, wherein the resistive element is formed by a transistor.

7. The memory device according to claim 3, wherein the potential circuit comprises a diode coupled in parallel to the transistor, a cathode of the diode being coupled to the first terminal of the transistor.

8. The memory device according to claim 3, further comprising a further transistor coupled in parallel to the transistor, the further transistor being arranged to form a diode.

9. The memory device according to claim 3, comprising a further transistor coupled in parallel to the transistor, the further transistor being arranged to form a resistive element.

10. The memory device according to claim 3, wherein the potential controller is configured to apply a pulse to the control terminal of the transistor, the potential circuit being configured to generate the third potential in response to the pulse.

11. The memory device according to claim 10, wherein the potential circuit comprises a further transistor having a first terminal, a second terminal and a control terminal, the second terminal of the further transistor being coupled to the first terminal of the transistor, the potential controller being configured to apply a further pulse to the control terminal, the further pulse being longer than the pulse.

12. The memory device according to claim 1, further comprising a further bit line for writing either the first information value or the second information value to the memory element, the potential controller being further coupled to the further bit line, the potential controller being configured to apply the third potential to the further bit line when writing the second information value to the memory element.

13. The memory device according to claim 12, wherein the potential controller comprises a potential circuit coupled to the bit line for generating the third potential when writing the first information value to the memory element and a further potential circuit coupled to the further bit line for generating the third potential.

14. The memory device according to claim 12, wherein the potential controller is configured to activate only the potential circuit or to activate only a further potential circuit at a given time same time.

15. The memory device according to claim 12, wherein the potential controller is configured to apply the third potential to the bit line and to apply the second potential to the further bit line when writing the first information value to the memory element, and to apply the second potential to the bit line and the third potential to the further bit line when writing the second information value to the memory element.

16. The memory device according to claim 1, wherein the potential controller is figured to apply the second potential to the bit line when writing the second information value to the memory element.

17. The memory device according to claim 1, wherein the potential controller is configured to apply a fourth potential to the bit line when writing the second information value to the memory element, the fourth potential being greater than the second potential.

* * * * *